(12) United States Patent
Kang et al.

(10) Patent No.: US 11,414,749 B1
(45) Date of Patent: Aug. 16, 2022

(54) FORMATION OF LITHIUM-METAL-CARBON PROTECTING LAYER AND REMOVAL OF LITHIUM CARBONATE ON LITHIUM METAL

(71) Applicant: UCHICAGO ARGONNE, LLC, Chicago, IL (US)

(72) Inventors: Donghyeon Kang, Willowbrook, IL (US); Jeffrey W. Elam, Elmhurst, IL (US); Anil U. Mane, Naperville, IL (US)

(73) Assignee: UChicago Argonne, LLC, Chicago, IL (US)

( * ) Notice: Subject to any disclaimer, the term of this patent is extended or adjusted under 35 U.S.C. 154(b) by 0 days.

(21) Appl. No.: 17/207,375

(22) Filed: Mar. 19, 2021

(51) Int. Cl.
*C23C 16/18* (2006.01)
*C23C 16/455* (2006.01)

(52) U.S. Cl.
CPC ............ *C23C 16/18* (2013.01); *C23C 16/455* (2013.01)

(58) Field of Classification Search
None
See application file for complete search history.

(56) References Cited

U.S. PATENT DOCUMENTS

| | | | |
|---|---|---|---|
| 4,009,052 | A | 2/1977 | Whittingham |
| 8,535,832 | B2 | 9/2013 | Karthikeyan et al. |
| 10,553,874 | B2 | 2/2020 | Elam et al. |
| 2004/0072066 | A1 | 4/2004 | Cho et al. |
| 2005/0074983 | A1* | 4/2005 | Shinriki ............... F16K 5/0407 438/785 |
| 2011/0070141 | A1* | 3/2011 | Sneh ................ C23C 16/45502 423/325 |
| 2013/0177808 | A1 | 7/2013 | Wang et al. |
| 2013/0333835 | A1 | 12/2013 | Carcia et al. |
| 2013/0337259 | A1 | 12/2013 | Carcia et al. |
| 2015/0180023 | A1 | 6/2015 | Xiao et al. |
| 2015/0357494 | A1 | 12/2015 | Dean et al. |
| 2015/0364747 | A1 | 12/2015 | Elam et al. |
| 2016/0351973 | A1 | 12/2016 | Albano et al. |
| 2017/0263935 | A1 | 9/2017 | Kozen et al. |
| 2017/0338522 | A1 | 11/2017 | Hu et al. |
| 2018/0277830 | A1 | 9/2018 | Xing |
| 2019/0044151 | A1* | 2/2019 | Elam ................ C23C 16/45553 |
| 2019/0312254 | A1* | 10/2019 | Xiao .................. H01M 4/0471 |
| 2020/0052326 | A1 | 2/2020 | Hu et al. |

FOREIGN PATENT DOCUMENTS

WO   WO-2016/057426 A1   4/2016

OTHER PUBLICATIONS

Han, X., et al., "Negating interfacial impedance in garnet-based solid-state Li metal batteries", Nature Materials, 2017, 16:572-579 (advanced online publication provided; 9 pages).
Julien, C.M., et al., "Functional behavior of $AlF_3$ coatings for high-performance cathode materials for lithium-ion batteries", AIMS Materials Science, 2019, 6(3):406-440.
Lee, Y-G., et al., "High-energy long-cycling all-solid-state lithium metal batteries enabled by silver-carbon composite anodes", Nature Energy, 2020, 5:299-308.
Lin, D., et al., "Reviving the lithium metal anode for high-energy batteries", Nature Nanotechnology, 2017, 12:194-206.
McCloskey, B.D., et al., "Twin Problems of Interfacial Carbonate Formation in Nonaqueous $Li-O_2$ Batteries", The Journal of Physical Chemistry Letters, 2012, 3(8):997-1001.
Talik, E., et al., "Electronic and crystal structure, EPR and magnetic investigations of $YF_3$:1%RE (RE=Pr, Ho, Er and Tm) and $LaF_3$:1% Pr nanocrystals", Journal of Alloys and Compounds, 2014, 616:556-568.
Xu, R., et al., "Artificial Interphases for Highly Stable Lithium Metal Anode", Matter, 2019, 1(2):317-344.
Zhang R., et al., "Coralloid Carbon Fiber-Based Composite Lithium Anode for Robust Lithium Metal Batteries", Joule, 2018, 2(4):764-777.
Zhang, H., et al., "Lithiophilic-lithiophobic gradient interfacial layer for a highly stable lithium metal anode", Nature Communications, 2018, 9:3729, 11 pages.
Aurbach, et al., "A short review of failure mechanisms of lithium metal and lithiated graphite anodes in liquid electrolyte solutions," Solid State Ionics 148(3-4), pp. 405-416 (2022).
Aurbach, et al., "The Study of Surface Phenomena Related to Electrochemical Lithium Intercalation into Lix MOy Host Materials (M=Ni, Mn)," Journal of the Electrochemical Society 147(4), pp. 1322-1331 (2000).
Kozen, et al., "Next-Generation Lithium Metal Anode Engineering via Atomic Layer Deposition," ACS Nano 9(6), pp. 5884-5892 (2015).
Shin, et al., "Comparison of Solvent-Cast and Hot-Pressed P(EO)20LiN(SO2CF2CF3)2 Polymer Electrolytes Containing Nanosized SiO2," Journal of the Electrochemical Society 152(2), pp. A283-A288 (2005).
Shin, et al., "PEO-Based Polymer Electrolytes with Ionic Liquids and Their Use in Lithium Metal-Polymer Electrolyte Batteries," Journal of the Electrochemical Society 152(5), pp. A978-A983 (2005).
Whittingham, "Electrical Energy Storage and Intercalation Chemistry," Science 192(4244), pp. 1126-1127 (1976).
Zheng, et al., "Interconnected hollow carbon nanospheres for stable lithium metal anodes," Nature Nanotechnology 9, pp. 618-623 (2014).

* cited by examiner

*Primary Examiner* — Jose I Hernandez-Kenney
(74) *Attorney, Agent, or Firm* — Foley & Lardner LLP

(57) ABSTRACT

A process for forming a lithium-metal-carbon film on a lithium metal structure. A metal-ligand complex is exposed to the metal ligand, such as for 5-30 seconds in a chemical vapor transfer reactor at a temperature of 100-180° C.

18 Claims, 11 Drawing Sheets

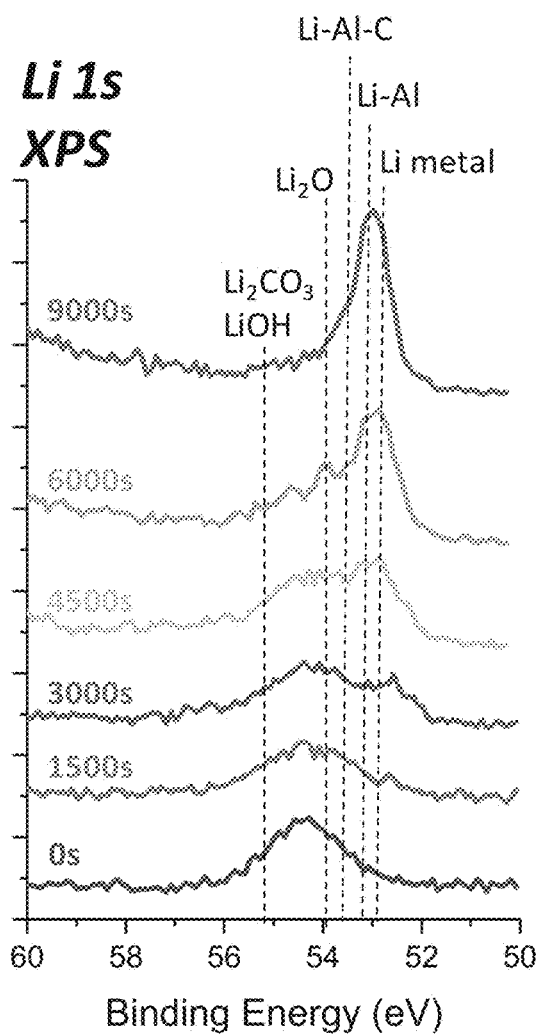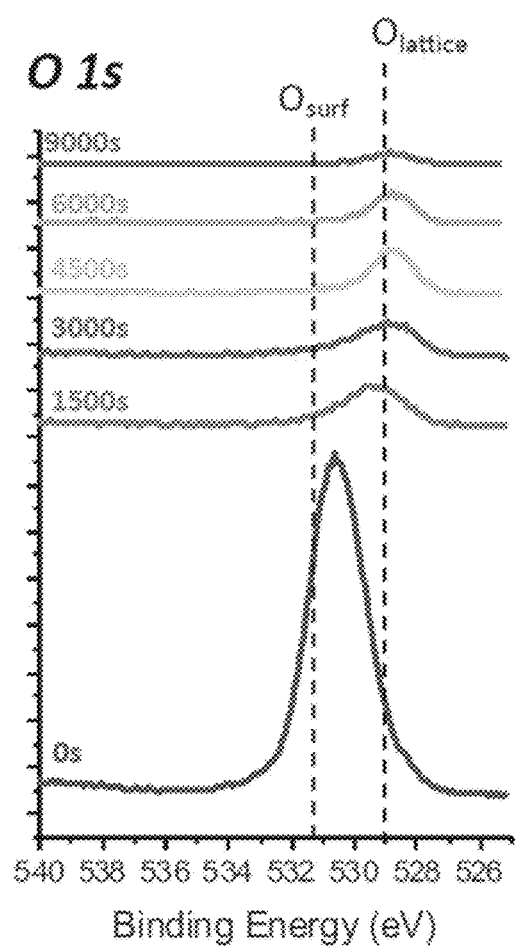
FIG. 5C
FIG. 5D

Symmetric cell configuration for bare Li electrodes

Symmetric cell configuration for Li-Al-C coated Li electrodes

US 11,414,749 B1

FORMATION OF LITHIUM-METAL-CARBON PROTECTING LAYER AND REMOVAL OF LITHIUM CARBONATE ON LITHIUM METAL

STATEMENT OF GOVERNMENT INTEREST

This invention was made with government support under Contract No. DE-ACO2-06CH11357 awarded by the United States Department of Energy to UChicago Argonne, LLC, operator of Argonne National Laboratory. The government has certain rights in the invention.

TECHNICAL FIELD

The present disclosure relates to formation of lithium-metal-carbon layer.

BACKGROUND

Lithium-metal based batteries ("LMB") are of widespread use in a range of applications necessitating various sizes and voltages. LMBs are susceptible to dendrite formation and the formation of "dead lithium" during battery cycling. Further, impeding coatings, such as lithium carbonate ($Li_2CO_3$) form on the surface of lithium metal. Such degradation of LMBs results in an increase in impedance, such as between anodes and electrolytes. Removal of such degradation and application of protective layers is desired for the improvement of overall lifetime performance.

There are numerous existing methods for protecting LMBs, particularly lithium metal anodes, from such deleterious processes. However, current methods have undesirable attributes, such as being multi-step processes or exhibiting poor scalability to industrial scale use. For example, applying polymeric protecting layers by simple dipping in the solution and/or spin-coating does not completely protect the surface of lithium metal anode, and it results in fast failure of battery cycling. As another example, using chemical reaction typically requires complicated sequence, resulting in high process cost.

Further, the existence of an already $Li_2CO_3$ layer on the top of lithium metal anodes presents a challenge. Current methods rely on physically stripping off the $Li_2CO_3$ layer using a brush or other physical interactions. This method is not scalable and practical to apply to industrial process. Furthermore, in case of ultra-thin lithium metal, physical stripping is not feasible.

Therefore, there remains a need for a process for removing lithium carbonate from lithium metal and forming lithium metal protective layers on the lithium metal.

SUMMARY

One embodiment relates to a method comprising placing a lithium metal structure in a reactor. A metal-ligand precursor vapor is flowed in a carrier gas, the comprising a metal selected from Al, In, Ga, and Zn and a ligand selected from the group consisting of an alkyl, through the reactor at a temperature of 100-180° C. for flow time of 5-30 seconds. The metal-ligand complex is reacted with lithium metal of the lithium metal structure, forming a lithium-metal-carbon film on the lithium metal structure.

Another embodiment relates to a method comprising placing a lithium metal structure in a reactor, the lithium metal structure having an exposed coating of lithium carbonate. The method further comprises flowing a metal-ligand complex precursor vapor in a carrier gas, the comprising a metal selected from Al, In, Ga, and Zn and an alkyl ligand, through the reactor at a temperature of 100-150° C. for flow time of 5-30 seconds. The metal-ligand complex is reacted with the lithium carbonate of the lithium metal structure, removing a portion of the lithium carbonate from the lithium metal structure.

This summary is illustrative only and is not intended to be in any way limiting. Other aspects, inventive features, and advantages of the devices or processes described herein will become apparent in the detailed description set forth herein, taken in conjunction with the accompanying figures, wherein like reference numerals refer to like elements.

BRIEF DESCRIPTION OF THE FIGURES

The foregoing and other features of the present disclosure will become more fully apparent from the following description and appended claims, taken in conjunction with the accompanying drawings. Understanding that these drawings depict only several implementations in accordance with the disclosure and are, therefore, not to be considered limiting of its scope, the disclosure will be described with additional specificity and detail through use of the accompanying drawings.

FIG. 4A illustrates the process of exposure of a bare Li-metal button to a flow of $Al(CH_3)_3$ vapor for 20 seconds at 150° C. in a reactor. FIG. 4B illustrates the Li—Al—C layer coated on the lithium metal.

FIGS. 5A-5E illustrate XPS depth profile results for the Li—Al—C layer coated Li-metal button, providing an indication of the relative depth of the indicated compounds. FIG. 5A is a graphical representation of the coated button. FIG. 5B is a graph of XPS data for carbon. FIG. 5C is a graph of XPS data for lithium. FIG. 5D is a graph of XPS data for oxygen. FIG. 5E is a graph of XPS data for aluminum.

Figure 1A:
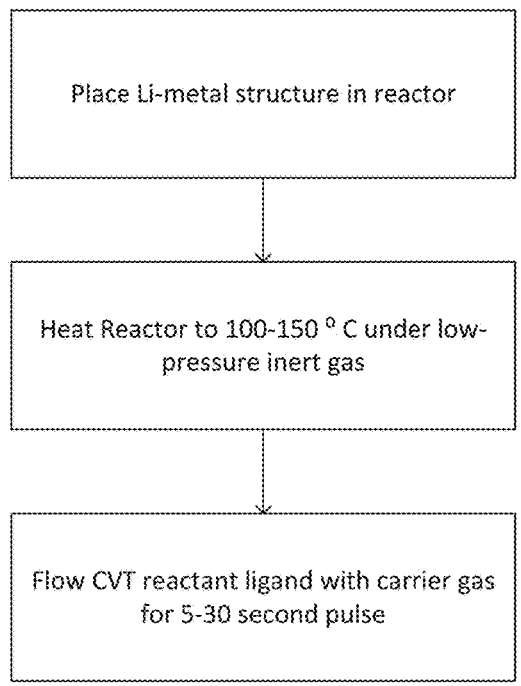
FIG. 1A is a flow chart depicting one embodiment of a process for depositing a lithium-metal-carbon (Li-M-C) layer on lithium metal films.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION

Before turning to the figures, which illustrate certain exemplary embodiments in detail, it should be understood that the present disclosure is not limited to the details or methodology set forth in the description or illustrated in the figures. It should also be understood that the terminology used herein is for the purpose of description only and should not be regarded as limiting.

Figure 1B:
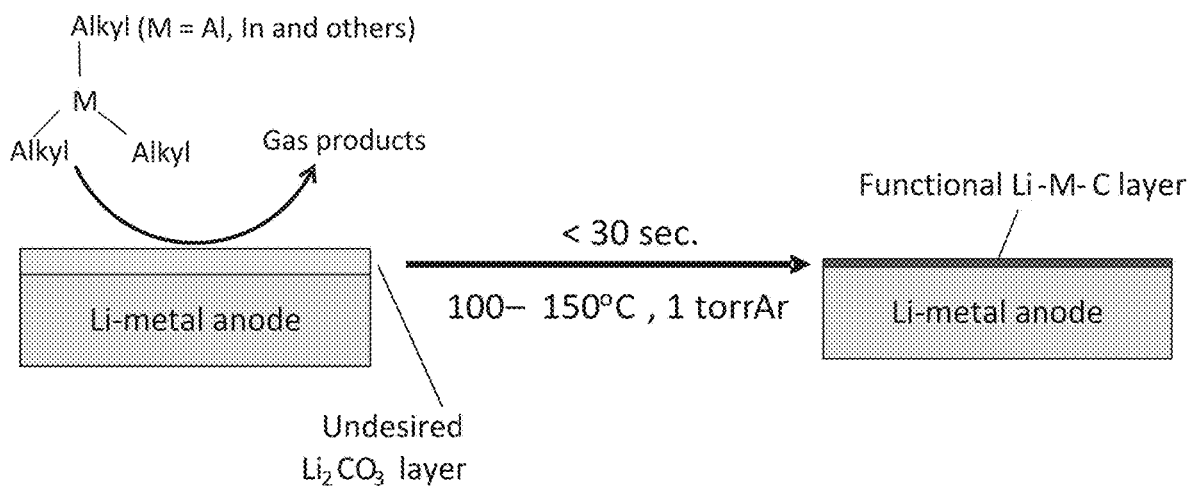
FIG. 1B illustrates a reaction schematic for the process of removing the $Li_2CO_3$ layer and forming a Li-M-C layer.

In one embodiment, such as illustrated in FIG. 1A, a process for removal of a deleterious coating and application of a desired protective coating on a lithium metal is provided. FIG. 1B illustrates a reaction schematic for the process of removing the $Li_2CO_3$ layer and forming a lithium-metal-carbon ("Li-M-C") layer using an alkylated metal precursor with metal, M. This process is termed chemical vapor treatment ("CVT") and involves the simultaneous etching or removal of oxygen to create oxygen-containing vapors, and the deposition of metal M to form the Li-M-C composite layer. This CVT is distinct from chemical vapor deposition ("CVD") which uses a constant supply of one or more chemical vapors and is purely a deposition process with no etching. CVT is also distinct from atomic layer deposition ("ALD") which uses alternating exposures to two chemical vapors to grow materials via deposition with no etching.

For example, one such process utilizes a low temperature (e.g., 100-150° C.) to remove $Li_2CO_3$ at the surface of lithium metal and apply Li-M-C composite layer as a single process. FIG. 1A illustrates a general overview of such a process. Notably, the illustrated embodiment uses Li metal as the substrate. As a result, such embodiments must be performed below the melting point of Li (180° C. at standard conditions), for example within the temperature range of 100–150° C. Further, in one embodiment, the CVT exposure of the CVT precursor is for 30 seconds or less. The CVT results in a Li-M-C layer, where M is, for example, Al, In, Ga, and Zn In a first step, a lithium metal structure, such as a lithium metal anode for use in a LMB, is positioned in a reactor. The lithium-metal structure may be commercial lithium metals. The lithium-metal structure may include a lithium carbonate layer or film, for example a film that has formed upon exposing the surface bulk lithium metal to ambient air. The lithium metal structure can be a lithium metal foil, or a thin film of lithium metal supported on a metal substrate such as a copper foil. The lithium thin film can be prepared by a variety of methods including electrodeposition, vapor deposition, melting, and mechanical pressing or rolling. The lithium metal structure may also be a composite structure where the lithium metal has been infused into a matrix.

The reactor is heated to 100-180° C., such as 100-150° C., 120-170° C., 130-160° C., 140-160° C., or 145-155° C. The reactor may be heated before or after the lithium metal structure is loaded into the reactor. The temperature must remain below the melting point of lithium metal, for example 180.5° C. The CVT reactions will be slower at lower reactor temperatures adding to the process time. As such, in one embodiment, the preferred reactor temperature is in between 100-150° C. The heating may, in one embodiment, be under a low pressure (0.05-10 Torr, such as 1 Torr) of an inert gas. The inert gas flow velocity should be in the range of 0.1-20 m/s, or preferably 2 m/s and will help to sweep away contaminants that desorb from the reactor walls and the lithium metal surface. Alternatively, the heating can be performed under high vacuum or ultrahigh vacuum conditions of $10^{-6}$-$10^{-10}$ Torr to avoid contamination of the lithium surface from background impurities, but this can complicate the heating process and increase processing time and equipment costs.

In a next step, a chemical vapor treatment ("CVT") is utilized, with a CVT precursor flowed into the reactor, such as with a carrier gas, for a 5-30 second exposure time of the precursor but preferably about 20 seconds. The precursor partial pressure can be in the range of 0.001-10 Torr but preferably in the range of about 0.1 Torr. Generally speaking, longer exposure times can be used with lower precursor partial pressures, and shorter exposure times can be used with higher precursor partial pressures such that the product of exposure time and partial pressure is approximately 2 Torr seconds.

In one embodiment, the CVT precursor may be selected from the precursors noted below in the forms for the noted example metals in Table 1. Alkyl ligands (e.g., methyl, ethyl, propyl, etc.) are effective in the CVT process. In contrast, alkoxy ligands such as isopropoxy and alkylamido ligands such as dimethylamido are not effective in the CVT process. Precursors having larger alkyl ligands (e.g., tert-butyl) will generally have lower vapor pressures compared to precursors with the same metal but having smaller alkyl ligands (e.g., methyl) and so will require longer CVT processing times relative to precursors with smaller alkyl ligands.

TABLE 1

| | Metal | | |
| --- | --- | --- | --- |
| Ligand | Aluminum | Gallium | Indium |
| methyl: $CH_3$ | $Al(CH_3)_3$ | $Ga(CH_3)_3$ | $In(CH_3)_3$ |
| ethyl: $CH_2CH_3$ | $Al(CH_2CH_3)_3$ | $Ga(CH_2CH_3)_3$ | $In(CH_2CH_3)_3$ |
| propyl: $CH_2CH_2CH_3$ | $Al(CH_2CH_2CH_3)_3$ | $Ga(CH_2CH_2CH_3)_3$ | $In(CH_2CH_2CH_3)_3$ |
| isopropyl: $CH(CH_3)_2$ | $Al(CH(CH_3)_2)_3$ | $Ga(CH(CH_3)_2)_3$ | $In(CH(CH_3)_2)_3$ |

TABLE 1-continued

| Ligand | | |
|---|---|---|
| butyl: $CH_2CH_2CH_2CH_3$ | $Al(CH_2CH_2CH_2CH_3)_3$ | $Ga(CH_2CH_2CH_2CH_3)_3$ $In(CH_2CH_2CH_2CH_3)_3$ |
| isobutyl: $CH_2CH(CH_3)_2$ | $Al(CH_2CH(CH_3)_2)_3$ | $Ga(CH_2CH(CH_3)_2)_3$ $In(CH_2CH(CH_3)_2)_3$ |
| tert-butyl: $C(CH_3)_3$ | $Al(C(CH_3)_3)_3$ | $Ga(C(CH_3)_3)_3$ $In(C(CH_3)_3)_3$ |

| | Metal | |
|---|---|---|
| Ligand | Zinc | Cadmium |
| methyl: $CH_3$ | $Zn(CH_3)_3$ | $Cd(CH_3)_2$ |
| ethyl: $CH_2CH_3$ | $Zn(CH_2CH_3)_2$ | $Cd(CH_2CH_3)_2$ |
| propyl: $CH_2CH_2CH_3$ | $Zn(CH_2CH_2CH_3)_2$ | $Cd(CH_2CH_2CH_3)_2$ |
| isopropyl: $CH(CH_3)_2$ | $Zn(CH(CH_3)_2)_2$ | $Cd(CH(CH_3)_2)_2$ |
| butyl: $CH_2CH_2CH_2CH_3$ | $Zn(CH_2CH_2CH_2CH_3)_2$ | $Cd(CH_2CH_2CH_2CH_3)_2$ |
| isobutyl: $CH_2CH(CH_3)_2$ | $Zn(CH_2CH(CH_3)_2)_2$ | $Cd(CH_2CH(CH_3)_2)_2$ |
| tert-butyl: $C(CH_3)_3$ | $Zn(C(CH_3)_3)_2$ | $Cd(C(CH_3)_3)_2$ |

While existing methods use physical polishing to remove the lithium carbonate, this has been shown to be less than complete. FIG. 2B shows the XPS data for surface cleaning by a hand-brush to remove the lithium carbonate from a lithium metal. As can be seen, the cleaned sample exhibits some lithium carbonate. FIG. 2C shows a similar XPS graph for a sample with lithium carbonate removed in accordance with an embodiment herein.

In one embodiment, the process may be used to react with the lithium carbonate layer on the lithium metal structure. The reaction parameters, including flow, pressure, temperature, and exposure time are selected to remove the lithium carbonate layer. Removal of the lithium carbonate layer is dependent on the amount of lithium carbonate at the lithium metal surface and CVT process time. For example, where the lithium metal structure is covered with 80% of $Li_2CO_3$ layer by XPS, at least 30 seconds are required to remove 99% of $Li_2CO_3$ contaminant on the lithium metal structure. The lithium metal structure is less contaminated by $Li_2CO_3$, the process time is less.

In one embodiment, the process may be used to react with the lithium metal structure's surface lithium metal. The reaction parameters, including flow, pressure, temperature, and exposure time are selected to form a lithium-metal-carbon (Li-M-C) layer, where the metal originates from the metal precursors used for CVT process. When $Li_2CO_3$-free lithium metal structure (pure lithium metal structure) is used for the CVT process, the metal precursor immediately reacts with lithium metal surface, producing lithium-metal-carbon layer between 100-150° C. When $Li_2CO_3$-free lithium metal structure is used, the Li-M-C layer is formed less than 5 seconds, typically 2 seconds at 150° C.

In a further embodiment, the process maybe be used to remove lithium carbonate and form a lithium-metal-carbon layer during the same exposure of metal precursors. For example, when the $Li_2CO_3$-contaminated lithium metal structure is processed by CVT reaction, the specific metal precursor firstly removes the surface $Li_2CO_3$ contaminant on the lithium metal structure. Once the surface $Li_2CO_3$ contaminant is removed, the metal precursor immediately reacts with lithium metal surface, producing lithium-metal-carbon (Li-M-C) layer.

In one embodiment, a process for removal of $Li_2CO_3$ comprises applying trimethylaluminum ("TMA") for several seconds (depending on the thickness of $Li_2CO_3$) to completely remove surface $Li_2CO_3$ by reaction with TMA. During those exposures, a portion of the TMA reacts with exposed lithium metal and produces Li—Al alloys and Li—Al—C composite layer on the top of lithium metal. As a result, a lithium-aluminum-carbon (Li—Al—C) protecting layer is obtained on the top of lithium metal anode. In one embodiment, the protective Li—Al—C composite layer contains up to 90% of Li—Al—C and 10% oxygen. The coated lithium metal anode is $Li_2CO_3$-free, stable, and storable for a long time in a controlled atmosphere.

Certain embodiments herein provide, as compared to previous methods: (1) successful removal of $Li_2CO_3$ layer without physical polish, (2) a low-temperature process, (3) a reduced number of process ($Li_2CO_3$-cleaning and surface coating at one time), (4) a fast and scalable process.

EXPERIMENTS

Example 1

Figure 2A:
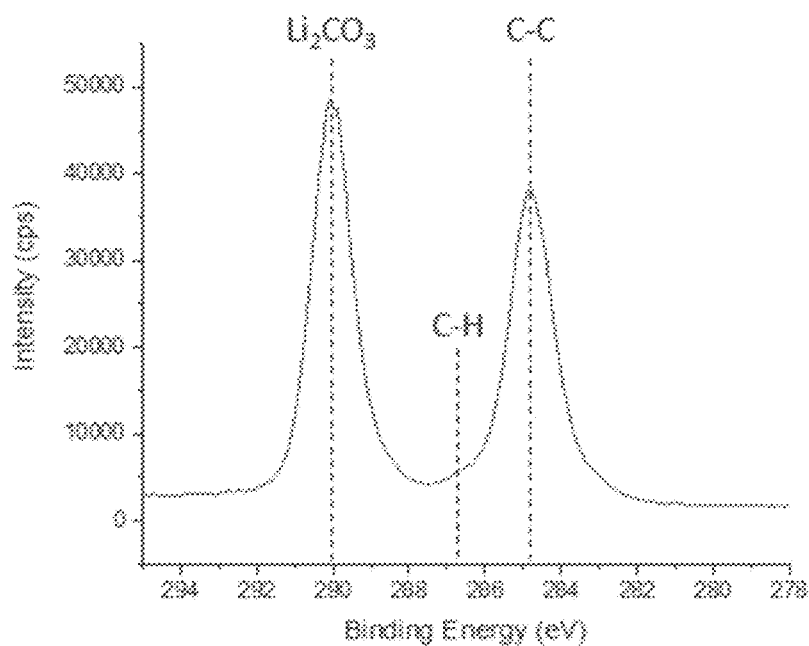
FIG. 2A shows the Carbon is X-ray photoelectron spectroscopy ("XPS") data for lithium carbonate contaminated lithium metal foils.
Figure 2B:
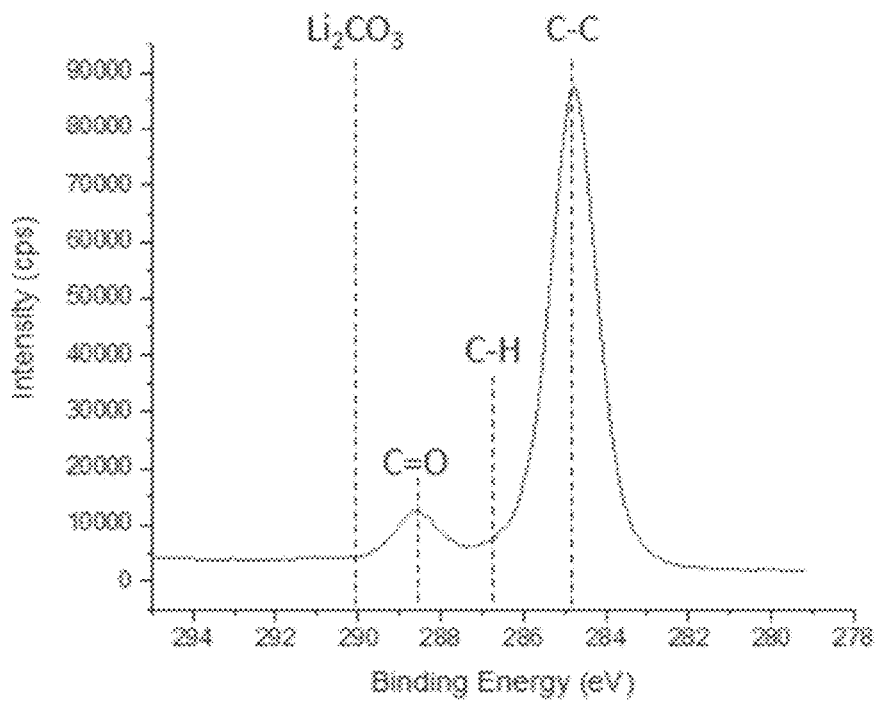
FIG. 2B shows a similar XPS data for a sample with lithium carbonate removed by hand-brushing.
Figure 2C:
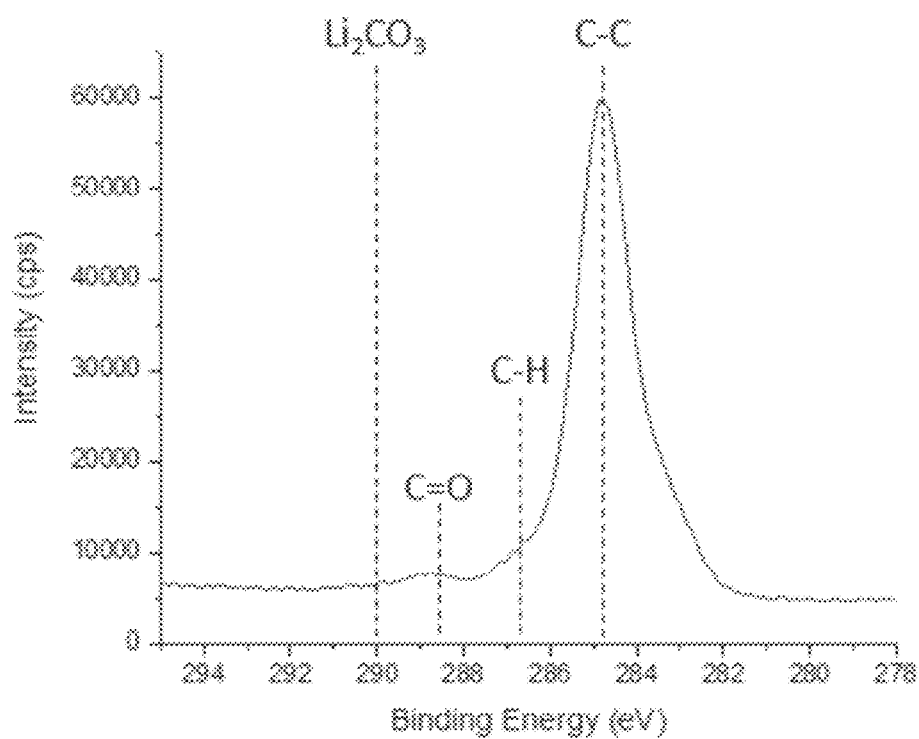
FIG. 2C shows a similar XPS data for a sample with lithium carbonate removed in accordance with an embodiment herein.
Figure 3:
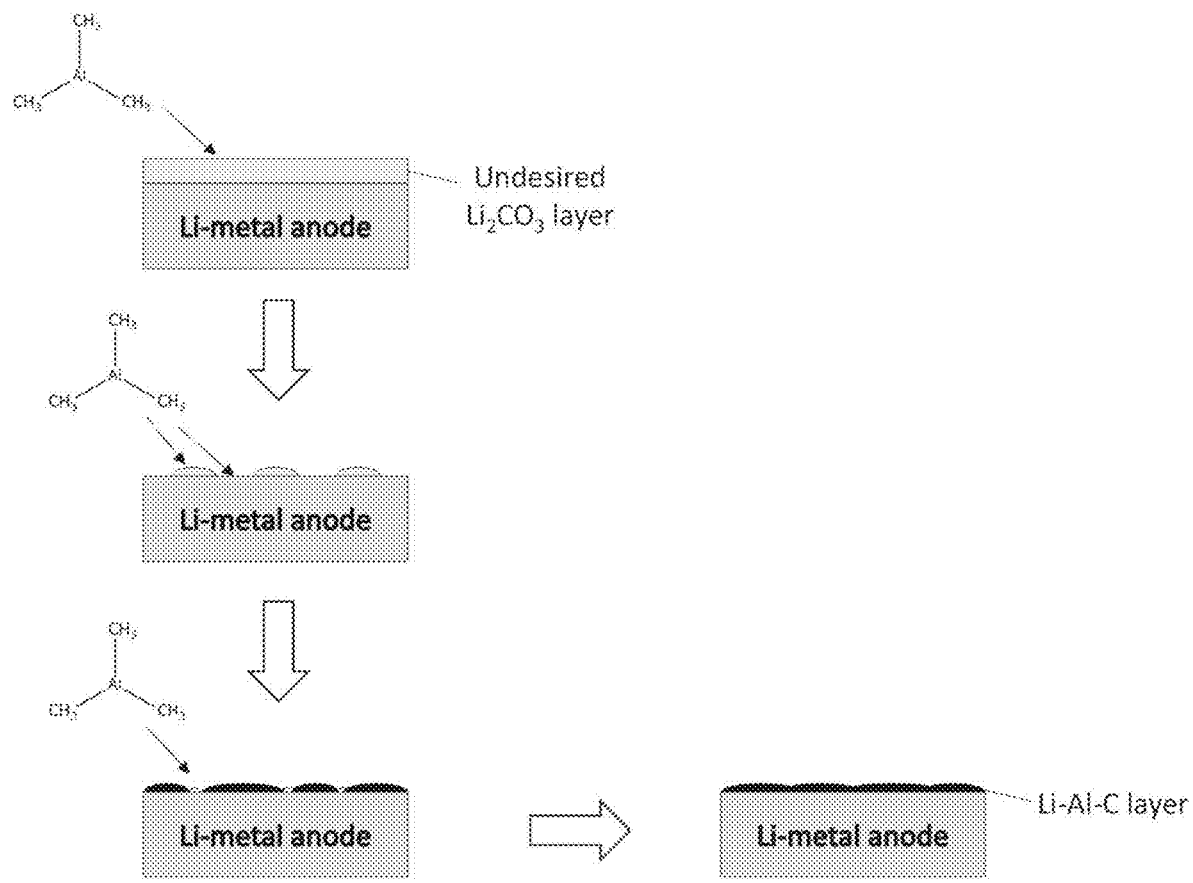
FIG. 3 illustrates a reaction pathway for one embodiment to remove carbonate and form a lithium-metal-carbon layer on a lithium metal anode.

FIGS. 2A and 2C show the results of for C1s XPS before treatment (FIG. 2A) and after treatment (FIG. 2C). For the experiments analyzed in FIGS. 2A and 2C, the treatment process involved flow of $Al(CH_3)_3$ vapor for 30 seconds to $Li_2CO_3$-contaminated Li-metal films at 150° C. in a reactor.

Example 2

Figure 4A:
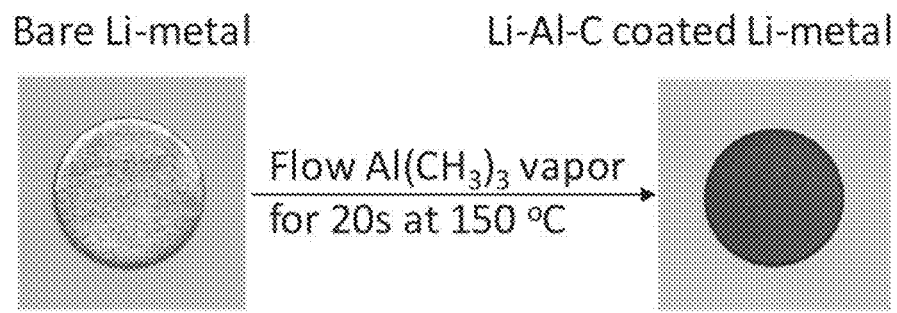
FIGS. 4A-4B show the results of an experiment on the formation of Li—Al—C layer on bare Li-metal.
Figure 4B:
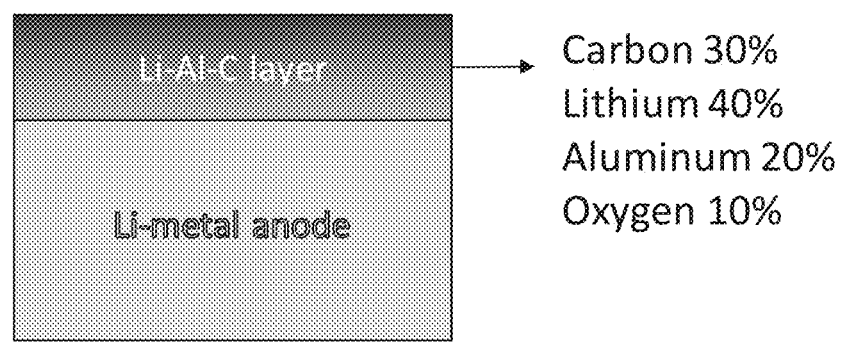
Figure 5A:
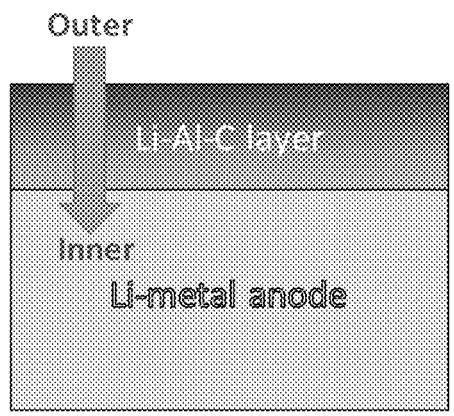
Figure 5B:
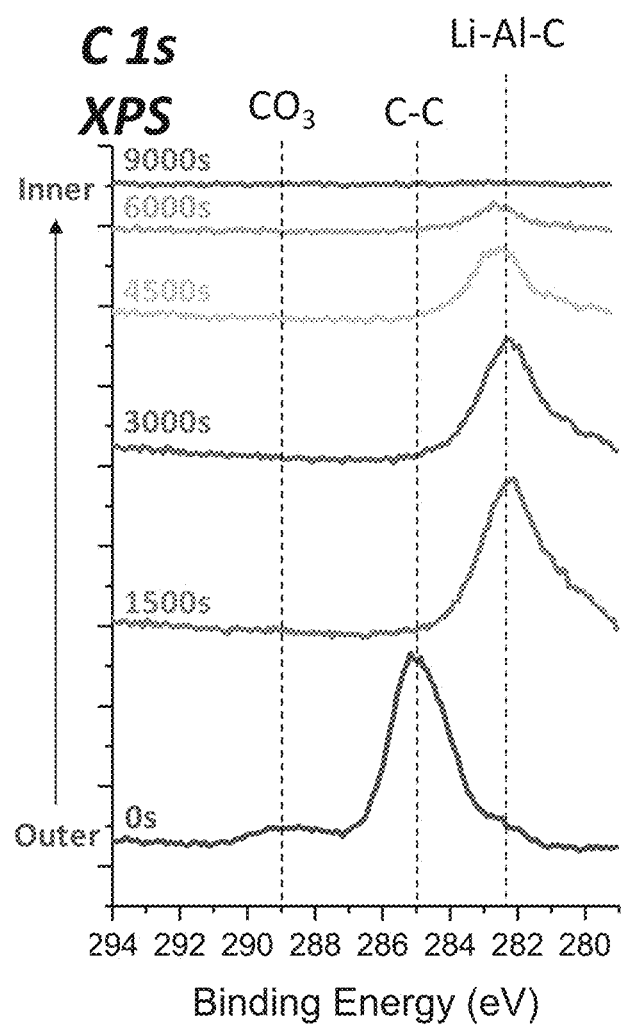
Figure 5E:
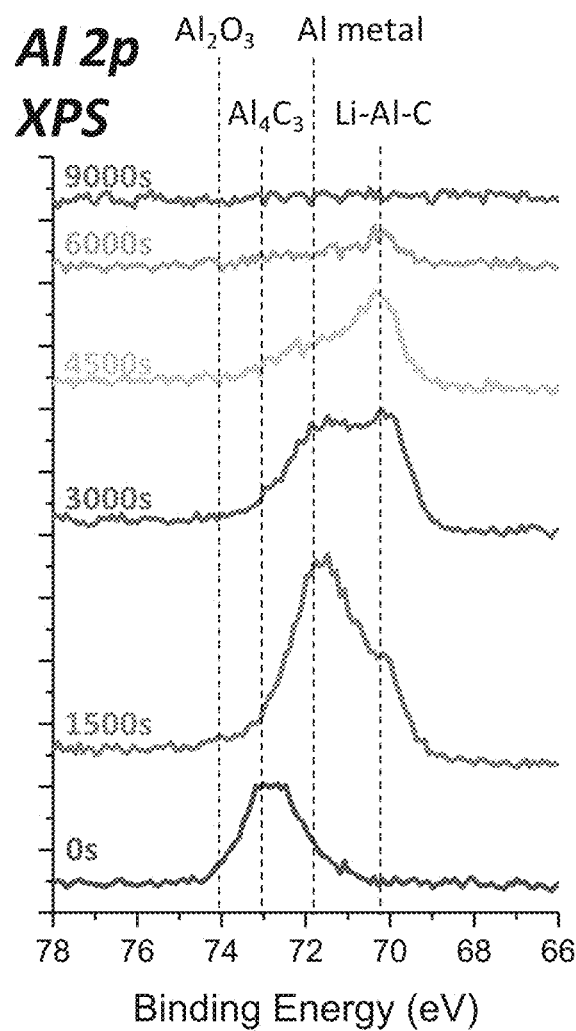

FIGS. 4A-4B show the results of an experiment on the formation of Li—Al—C layer on bare Li-metal anode (i.e., metal not having a pre-existing $Li_2CO_3$ layer). FIG. 4A illustrates the process of exposure of a bare Li-metal button to a flow of $Al(CH_3)_3$ vapor for 20 seconds at 150° C. in a reactor. The result is a coated button. FIG. 4B illustrates the Li—Al—C layer coated on the lithium metal. The Li—Al—C layer has a composition of 10-30% carbon, 20-50% lithium, 10-20% aluminum, and 5-10% oxygen. It is believed that the reaction may proceed as shown below:

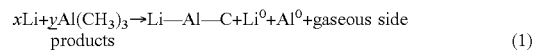

$$xLi + yAl(CH_3)_3 \rightarrow Li-Al-C + Li^0 + Al^0 + \text{gaseous side products} \quad (1)$$

FIGS. 5A-5E illustrate XPS depth profile results for the coated Li-metal button, providing an indication of the relative depth of the indicated compounds. The formation of the Li—Al—C layer is confirmed by the XPS data.

Example 3

In series of experiments, bare Li-metal button was exposed to metal precursors as follows: Example 3-1 underwent a Flow $Al(CH_3)_3$ for 30 sec, forming Li—Al—C layer forms; Example 3-2 underwent a flow of $Al[N(CH_3)_2]_3$ for 30 sec, with no observed coating; and Example 3-3 underwent a flow of Flow $Al[OCH(CH_3CH_3)_2]_3$ for 30 sec, with no observed coating.

Example 4

Figure 6A:
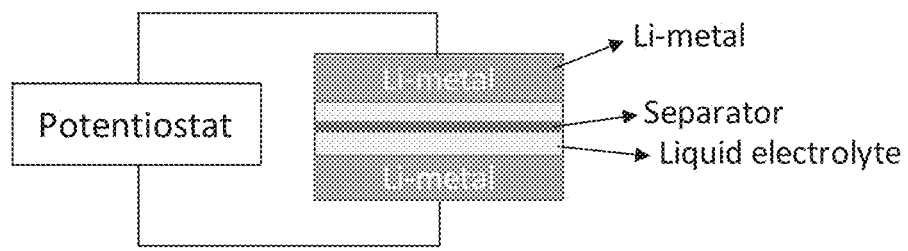
FIG. 6A illustrates the Li—Li symmetric cell configuration for the bare-Li sample.
Figure 6B:
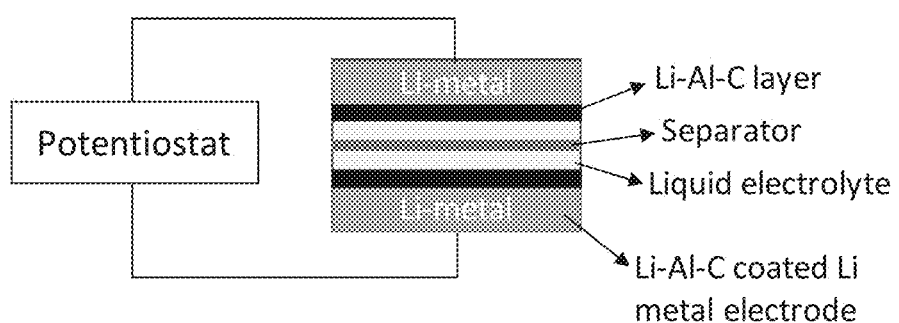
FIG. 6B illustrates the Li—Li symmetric cell configuration for the Li—Al—C coated samples.
Figure 6C:
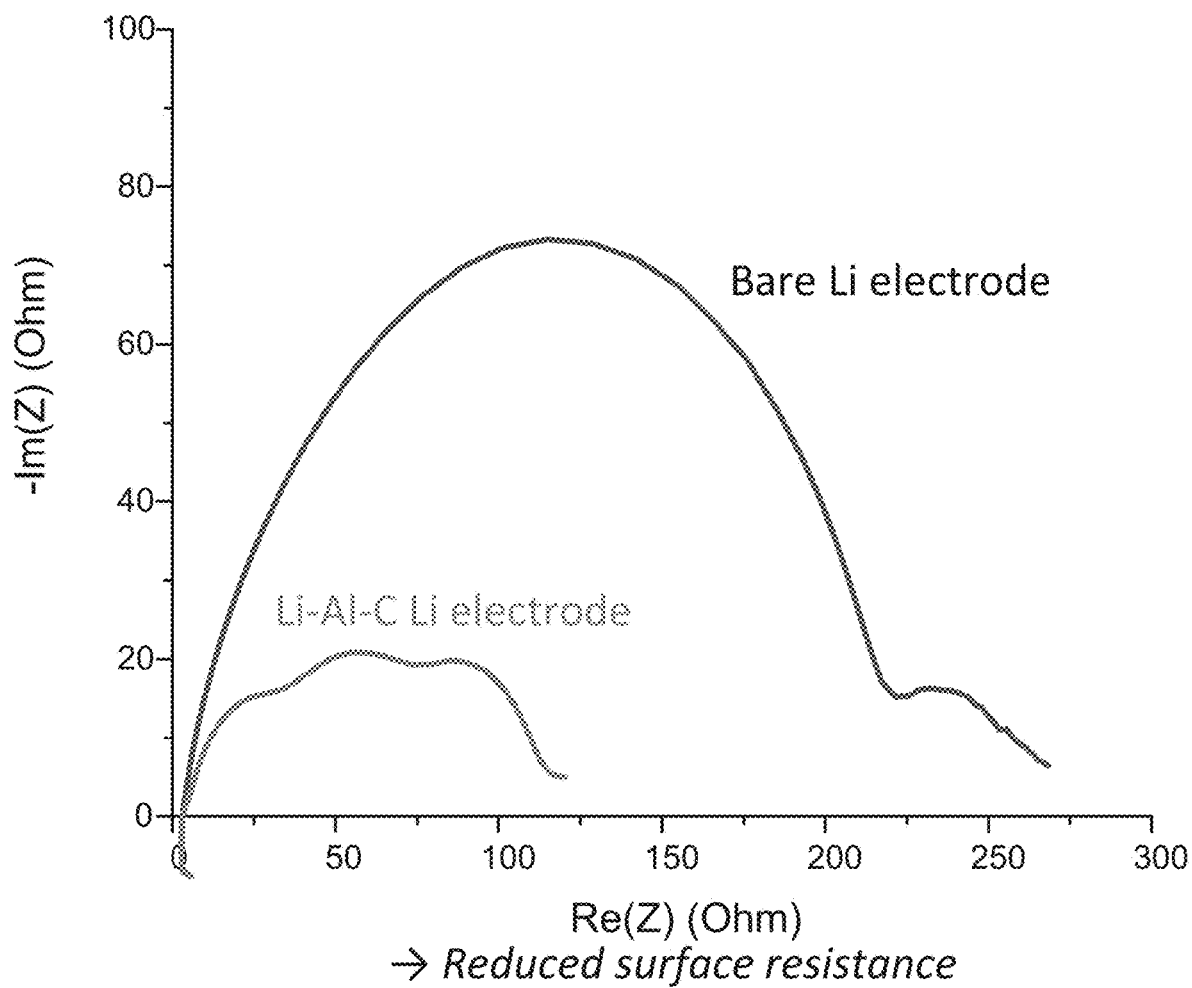
FIG. 6C is a graph of electrochemical impedance spectroscopy, with the Li—Al—C coated electrode demonstrating reduced surface resistance.

Sample coin cells were prepared using bare Li-metal electrodes and Li—Al—C coated Li electrodes fabricated in accordance with embodiments herein. FIG. 6A illustrates the coin cell configuration for the bare-Li sample. FIG. 6B illustrates the coin cell configuration for the Li—Al—C coated samples. For both cells, a liquid electrolyte comprised 1.2M $LiPF_6$ in EC/DMC (3:7). FIG. 6C is a graph of electrochemical impedance spectroscopy, with the Li—Al—C coated electrode demonstrating reduced surface resistance.

Example 5

Figure 7A:
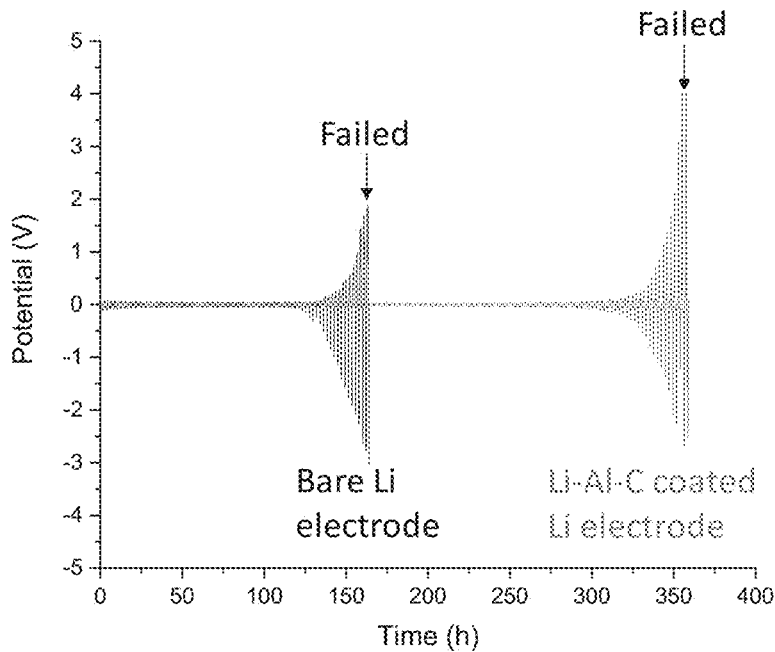
FIG. 7A illustrates Li—Li symmetric cell battery cycling for bare-Li sample (dark lines) and for the Li—Al—C coated samples (lighter lines), with Li—Li symmetric cells (using 20 μm Li foil) at low current (0.2 $mA/cm^2$ for 1 hour each cycling).
Figure 7B:
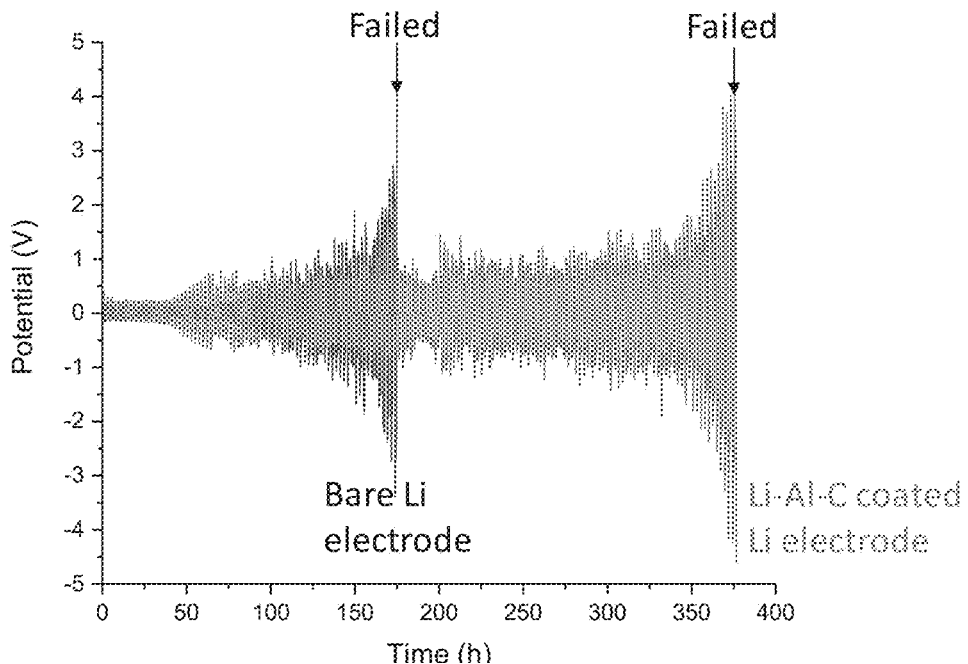
FIG. 7B illustrates Li—Li symmetric cell battery cycling for bare-Li sample (dark lines) and for the Li—Al—C coated samples (lighter lines), with Li—Li symmetric cells (using 600 μm Li chips) and high current (1.0 mA/cm² for 1 hour each cycling).

Sample coin cells were prepared using bare Li-metal electrodes and Li—Al—C coated Li electrodes fabricated in accordance with embodiments herein with the same structure as in Example 4. FIG. 7A illustrates Li—Li symmetric cell battery cycling for bare-Li sample (dark lines) and for the Li—Al—C coated samples (lighter lines), with Li—Li symmetric cells (using 20 μm Li foil) at low current (0.2 mA/cm² for 1 hour each cycling). FIG. 7B illustrates the cell configuration for bare-Li sample (dark lines) and for the Li—Al—C coated samples (lighter lines), with Li—Li symmetric cells (using 600 μm Li chips) at high current (1.0 mA/cm² for 1 hour each cycling).

The Li—Al—C coated electrodes exhibit roughly two times the batter cycling performance of the bare lithium electrode cells.

Definitions

No claim element herein is to be construed under the provisions of 35 U.S.C. § 112(f), unless the element is expressly recited using the phrase "means for."

As utilized herein, the terms "approximately," "about," "substantially," and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the disclosure as recited in the appended claims.

It should be noted that the term "exemplary" and variations thereof, as used herein to describe various embodiments, are intended to indicate that such embodiments are possible examples, representations, or illustrations of possible embodiments (and such terms are not intended to connote that such embodiments are necessarily extraordinary or superlative examples).

The term "coupled" and variations thereof, as used herein, means the joining of two members directly or indirectly to one another. Such joining may be stationary (e.g., permanent or fixed) or moveable (e.g., removable or releasable). Such joining may be achieved with the two members coupled directly to each other, with the two members coupled to each other using a separate intervening member and any additional intermediate members coupled with one another, or with the two members coupled to each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic. For example, circuit A communicably "coupled" to circuit B may signify that the circuit A communicates directly with circuit B (i.e., no intermediary) or communicates indirectly with circuit B (e.g., through one or more intermediaries).

The term "or," as used herein, is used in its inclusive sense (and not in its exclusive sense) so that when used to connect a list of elements, the term "or" means one, some, or all of the elements in the list. Conjunctive language such as the phrase "at least one of X, Y, and Z," unless specifically stated otherwise, is understood to convey that an element may be either X, Y, Z; X and Y; X and Z; Y and Z; or X, Y, and Z (i.e., any combination of X, Y, and Z). Thus, such conjunctive language is not generally intended to imply that certain embodiments require at least one of X, at least one of Y, and at least one of Z to each be present, unless otherwise indicated.

References herein to the positions of elements (e.g., "top," "bottom," "above," "below") are merely used to describe the orientation of various elements in the FIGURES. It should be noted that the orientation of various elements may differ according to other exemplary embodiments, and that such variations are intended to be encompassed by the present disclosure.

Although the figures and description may illustrate a specific order of method steps, the order of such steps may differ from what is depicted and described, unless specified differently above. Also, two or more steps may be performed concurrently or with partial concurrence, unless specified differently above.

What is claimed is:
1. A method, comprising:
placing a lithium metal structure in a reactor, the lithium metal structure having an exposed coating of lithium carbonate;
flowing a metal-ligand precursor vapor in a carrier gas, the metal-ligand precursor vapor comprising a metal selected from Al, In, Ga, and Zn and an alkyl ligand through the reactor at a temperature of 100-180° C. for a flow time of 5-30 seconds; and
reacting the metal-ligand precursor vapor with the exposed coating of lithium carbonate of the lithium metal structure, removing the lithium carbonate from the lithium metal structure;
reacting the metal-ligand precursor vapor with lithium metal of the lithium metal structure, forming a lithium-metal-carbon film on the lithium metal structure.

2. The method of claim 1, wherein the temperature is 130-160° C.

3. The method of claim 2, wherein the carrier gas has a flow velocity of 0.1-20 m/s.

4. The method of claim 2, wherein reacting the metal-ligand complex with lithium metal is under a high vacuum condition of $10^{-6}$-$10^{-10}$ Torr.

5. The method of claim 1, wherein the metal of the metal-ligand precursor vapor is aluminum.

6. The method of claim 4, wherein the lithium-metal-carbon film is a lithium-aluminum-carbon film.

7. The method of claim 1, wherein the lithium-metal-carbon film is a composite comprising up to 90% Li—Al—C and up to 10% oxygen.

8. A method, comprising:
placing a lithium metal structure in a reactor, the lithium metal structure having an exposed coating of lithium carbonate;
flowing a metal-ligand complex precursor vapor in a carrier gas, the metal-ligand complex precursor vapor comprising a metal selected from Al, In, Ga, and Zn and an alkyl ligand, through the reactor at a temperature of 100-150° C. for a flow time of 5-30 seconds; and
reacting the metal-ligand complex precursor vapor with the exposed coating of lithium carbonate of the lithium metal structure, removing a portion of the lithium carbonate from the lithium metal structure.

9. The method of claim 8, further comprising forming a lithium-metal-carbon film on the lithium metal structure.

10. The method of claim 9, wherein the metal of the metal-ligand complex precursor vapor is aluminum.

11. The method of claim 10, wherein the lithium-metal-carbon film is a lithium-aluminum-carbon film.

12. The method of claim 11, wherein the lithium-metal-carbon film is a composite comprising up to 90% Li—Al—C and up to 10% oxygen.

13. The method of claim 12, wherein the metal-ligand complex precursor vapor is trimethylaluminum.

14. The method of claim 8, wherein the temperature is 130-160° C.

15. The method of claim 14 wherein the carrier gas has a flow velocity of 0.1-20 m/s.

16. The method of claim 14, wherein reacting the metal-ligand complex with lithium metal is under a high vacuum condition of $10^{-6}$-$10^{-10}$ Torr.

17. The method of claim 8, wherein alkyl ligand of the metal-ligand complex precursor vapor is a methyl, ethyl, or propyl ligand.

18. The method of claim 8, wherein the metal-ligand vapor has a partial pressure of 0.001-10 Torr.

* * * * *